(12) United States Patent
Sakai et al.

(10) Patent No.: US 9,080,091 B2
(45) Date of Patent: *Jul. 14, 2015

(54) POLYESTER RESIN COMPOSITION FOR ELECTRICAL/ELECTRONIC PART-SEALING MATERIAL, SEALED PRODUCT, AND PRODUCTION METHOD THEREOF

(75) Inventors: Junko Sakai, Otsu (JP); Kenji Shiga, Otsu (JP)

(73) Assignee: TOYOBO CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/003,061

(22) PCT Filed: Feb. 21, 2012

(86) PCT No.: PCT/JP2012/054030
§ 371 (c)(1),
(2), (4) Date: Sep. 4, 2013

(87) PCT Pub. No.: WO2012/124435
PCT Pub. Date: Sep. 20, 2012

(65) Prior Publication Data
US 2013/0338318 A1 Dec. 19, 2013

(30) Foreign Application Priority Data

Mar. 17, 2011 (JP) ................. 2011-059094

(51) Int. Cl.
| | |
|---|---|
| C08L 67/07 | (2006.01) |
| C09K 3/10 | (2006.01) |
| C08G 63/64 | (2006.01) |
| B29C 39/00 | (2006.01) |
| H01L 23/29 | (2006.01) |
| H01G 9/10 | (2006.01) |
| H01G 4/224 | (2006.01) |
| C08L 69/00 | (2006.01) |
| B29K 75/00 | (2006.01) |
| B29K 105/12 | (2006.01) |

(52) U.S. Cl.
CPC ............. *C09K 3/1006* (2013.01); *B29C 39/006* (2013.01); *C08G 63/64* (2013.01); *C08L 69/005* (2013.01); *C09K 3/10* (2013.01); *H01G 4/224* (2013.01); *H01G 9/10* (2013.01); *H01L 23/293* (2013.01); *B29K 2075/00* (2013.01); *B29K 2105/122* (2013.01); *C09K 2200/0655* (2013.01); *H01L 2924/0002* (2013.01)

(58) Field of Classification Search
CPC ........... B29C 39/006; B29K 2105/122; B29K 2075/00; C09K 3/1006; C09K 2200/0655; C09K 3/10; C08L 69/005; C08G 63/64; H01L 23/293; H01L 2924/0002; H01G 9/10
USPC ...................................................... 525/439
See application file for complete search history.

(56) References Cited

U.S. PATENT DOCUMENTS

| | | | |
|---|---|---|---|
| 3,954,689 A | 5/1976 | Hoeschele | |
| 4,217,297 A | 8/1980 | Lindner et al. | |
| 4,254,001 A | 3/1981 | Tung | |
| 4,297,455 A | 10/1981 | Lindner et al. | |
| 5,304,593 A | 4/1994 | Nishio et al. | |
| 5,698,632 A | 12/1997 | Brown et al. | |
| 5,852,164 A * | 12/1998 | Akai et al. | 528/279 |
| 7,381,358 B2 | 6/2008 | Nishida et al. | |
| 8,030,417 B2 | 10/2011 | Maruyama et al. | |
| 2002/0026008 A1 | 2/2002 | Okamoto et al. | |
| 2003/0065070 A1 | 4/2003 | Nishida et al. | |
| 2004/0076805 A1 | 4/2004 | Oohori et al. | |
| 2004/0222564 A1 | 11/2004 | Nishida et al. | |
| 2009/0215933 A1 | 8/2009 | Kasai et al. | |
| 2010/0041858 A1 * | 2/2010 | Maruyama et al. | 528/306 |
| 2013/0331521 A1 | 12/2013 | Funaoka et al. | |

FOREIGN PATENT DOCUMENTS

| | | |
|---|---|---|
| EP | 0 323 914 | 7/1989 |
| EP | 1 167 448 A2 | 1/2002 |
| EP | 2 679 651 A1 | 1/2014 |
| JP | 54-4990 | 1/1979 |
| JP | 60-18562 | 1/1985 |
| JP | 1-236268 | 9/1989 |
| JP | 5-175371 | 7/1993 |
| JP | 5-295094 | 11/1993 |
| JP | 2000-178351 | 6/2000 |
| JP | 2000-178420 | 6/2000 |
| JP | 2001-206939 | 7/2001 |
| JP | 2001-240663 | 9/2001 |
| JP | 2003-192778 | 7/2003 |

(Continued)

OTHER PUBLICATIONS

Extended European Search Report issued Aug. 13, 2014 in corresponding European Patent Application No. 12757600.7.
International Search Report issued May 29, 2012 in International (PCT) Application No. PCT/JP2012/054030.
International Search Report issued May 29, 2012 in International (PCT) Application No. PCT/JP2012/054031.

*Primary Examiner* — Randy Gulakowski
*Assistant Examiner* — Christopher M Rodd
(74) *Attorney, Agent, or Firm* — Wenderoth, Lind & Ponack, L.L.P.

(57) ABSTRACT

It is provided that a polyester composition for electrical/electronic part-sealing material having melt fluidity, initial peel strength, and initial dielectric breakdown strength that are required for electrical/electronic part-sealing material while also having excellent heat resistance, resistance to thermal aging, and durability with respect to hot-cold cycling.

A polyester resin composition for electrical/electronic part-sealing material, comprising, as a main component, a copolymer polyester elastomer containing 50 weight % or more and 70 weight % or lower of an aliphatic polycarbonate segment and having 6 equivalents/$10^6$ g or more and 50 equivalents/$10^6$ g or lower of terminal vinyl groups.

8 Claims, No Drawings

(56) References Cited

FOREIGN PATENT DOCUMENTS

| | | |
|---|---|---|
| JP | 2004-83918 | 3/2004 |
| JP | 3553559 | 5/2004 |
| JP | 2007-138139 | 6/2007 |
| JP | 2007-191664 | 8/2007 |
| JP | 2007-191665 | 8/2007 |
| JP | 2008-163226 | 7/2008 |
| JP | 4389144 | 10/2009 |
| JP | 2010-150471 | 7/2010 |
| WO | 2008/093574 | 8/2008 |

* cited by examiner

POLYESTER RESIN COMPOSITION FOR ELECTRICAL/ELECTRONIC PART-SEALING MATERIAL, SEALED PRODUCT, AND PRODUCTION METHOD THEREOF

TECHNICAL FIELD

The present invention relates a polyester resin composition for electrical/electronic part-sealing material and an electrical/electronic sealed product excellent in resistance to thermal aging and durability with respect to hot-cold cycling.

BACKGROUND ART

Use of a polyester polyether-type elastomer having a crystalline polyester such as polybutylene terephthalate (PBT) and polybutylene naphthalate (PBN) as a hard segment and a long chain aliphatic polyether polyol with a low glass transition temperature (Tg) such as polytetramethylene glycol (PTMG) as a soft segment for an electronic sealing material as a soft segment has been previously known (e.g., Patent Document 1) and the elastomer has already been practically used. However, since the ether bonds in the long chain aliphatic polyester polyol are susceptible to heat decomposition and hydrolysis, the elastomer is limited in its heat resistance, resistance to thermal aging, and water-proofness, and its application is limited.

On the other hand, a polyester polycarbonate-type elastomer using a polycarbonate as a soft segment has been known as an elastomer excellent in heat resistance, resistance to thermal aging, and water-proofness (see, for example, Patent Documents 2 and 3).

PRIOR ART DOCUMENTS

Patent Documents

Patent Document 1: JP-A-2003-192778
Patent Document 2: JP-A-2001-206939
Patent Document 3: JP-A-2001-240663

SUMMARY OF THE INVENTION

Problems to be Solved by the Invention

However, in the case of using the conventionally known polyester polycarbonate-type elastomer as a sealing material for electrical/electronic part, it is understood that, although excellent in heat resistance, resistance to thermal aging, and water-proofness, the polyester polycarbonate-type elastomer is poor in fluidity due to high viscosity and therefore, it leads to problems that the injection pressure and injection temperature become extremely high at the time of injection molding; that a soldered part is melted or fluidized; that a lead wire of a capacitor or the like is melted or fluidized; and that an electronic part such as a capacitor is damaged by the injection pressure. Further, there is also a problem that a filling defect is easily caused owing to high melt viscosity, and it has been tried to lower the melt viscosity by increasing the injection temperature; however, problems of molding failures such as defective flow to a portion with a thickness of about 1 mm or thinner, a failure of flowing to the end from a gate, and the like still occur easily. Moreover, when an electrical/electronic part sealed with these elastomers is preserved under cold temperature, there occur problems that the elastomers are cracked and the inner parts are damaged and it results in operational failure in an operation test of the electrical/electronic part. From the above-mentioned results, it is made clear that the conventionally known polyester polycarbonate-type elastomer is improper as an electrical/electronic part-sealing material.

It is an object of the present invention to provide a resin composition for sealing electrical/electronic part having higher melt fluidity than that of the conventionally known polyester polycarbonate-type elastomer and having higher resistance to thermal aging than that of the conventionally known polyester polyether-type elastomer. Further, it is another object of the present invention to provide a polyester composition for electrical/electronic part-sealing material having melt fluidity, initial peel strength, and initial dielectric breakdown strength that are required for electrical/electronic part-sealing material while also having excellent heat resistance, resistance to thermal aging, and durability with respect to hot-cold cycling.

Solutions to the Problems

To achieve the above-mentioned objects, the present inventors have made various investigations and proposed the following invention.

That is, the present invention relates the following resin composition, the following sealed product of electrical/electronic part, which is sealed with the resin composition, and the following method for producing a sealed product of electrical/electronic part.

(1) A polyester resin composition for electrical/electronic part-sealing material, comprising, as a main component, a copolymer polyester elastomer containing 50 weight % or more and 70 weight % or lower of an aliphatic polycarbonate segment and having 6 equivalents/$10^6$ g or more and 50 equivalents/$10^6$ g or lower of terminal vinyl groups.

(2) The polyester resin composition for electrical/electronic part-sealing material according to (1), wherein the copolymer polyester elastomer is crystalline.

(3) The polyester resin composition for electrical/electronic part-sealing material according to (1) or (2), wherein a hard segment constituting the copolymer polyester elastomer contains an aromatic dicarboxylic acid with 8 to 14 carbon atoms in an amount of 50 mol % or more as acid components and an aliphatic glycol and/or alicyclic glycol with 2 to 10 carbon atoms in an amount of 50 mol % or more as glycol components.

(4) The polyester resin composition for electrical/electronic part-sealing material according to any one of (1) to (3), wherein a polycarbonate diol to be used for forming the aliphatic polycarbonate segment is an aliphatic polycarbonate diol residue with a reduced viscosity of 0.5 dl/g or more and 1.3 dl/g or lower.

(5) A sealed product of electrical/electronic part, which is sealed with the resin composition for electrical/electronic part-sealing material according to any one of (1) to (4).

(6) A method for producing a sealed product of electrical/electronic part comprising steps of: installing at least one of an electric cable, a circuit, and a terminal in a the and injecting the resin composition for electrical/electronic part-sealing material according to any one of (1) to (4) into the die after imparting fluidability to the resin composition under heating.

Effect of the Invention

The polyester resin composition of the present invention has melt fluidity suitable for sealing electrical/electronic part and is useful for sealing electrical/electronic part without damaging the electrical/electronic part by setting proper temperature and pressure owing to use of a copolymer polyester elastomer with the specified composition as a main component. The polyester resin composition of the present invention and a sealed product of electrical/electronic part obtained by using the composition are excellent in initial adhesion represented by initial peel strength to an object to be sealed and also excellent in initial electric insulation represented by initial dielectric breakdown strength owing to use of a copolymer polyester elastomer with the specified composition as a main component. The polyester resin composition of the present invention and a sealed product of electrical/electronic part obtained by using the composition are excellent in resistance to thermal aging, and show excellent resistance to thermal aging with a small decrease in tensile elongation, peel strength, and dielectric breakdown strength even after a heat load at, for example, 150° C. for 1000 hours owing to use of a copolymer polyester elastomer with the specified composition as a main component. The polyester resin composition of the present invention and a sealed product of electrical/electronic part obtained by using the composition are also excellent in durability with respect to hot-cold cycling, and not only the sealed product is hardly cracked but also the electrical/electronic part to be sealed is hardly damaged. Further, they show excellent durability with respect to hot-cold cycling with a small decrease in peel strength even after hot-cold cycling between, for example, −40° C. and 150° C.

MODE FOR CARRYING OUT THE INVENTION

Hereinafter, the polyester composition in the present invention will be described in detail.
<Polyester Resin Composition>

The polyester resin composition for electrical/electronic part-sealing material in the present invention comprises as a main component, a copolymer polyester elastomer containing 50 weight % or more and 70 weight % or lower of an aliphatic polycarbonate segment and having 6 equivalents/$10^6$ g or more and 50 equivalents/$10^6$ g or lower of terminal vinyl groups. Herein, "comprises as a main component" refers to a constituent components in the highest weight ratio in the entire amount of the resin composition, that is, the polyester resin composition for electrical/electronic part-sealing material containing the copolymer polyester elastomer in a weight ratio of preferably 50 weight % or higher, more preferably 70 weight % or higher, further preferably 90 weight % or higher.
<Copolymer Polyester Elastomer>

The copolymer polyester elastomer in the present invention has a chemical structure formed by linking a hard segment, which mainly contains a polyester segment, and a soft segment, which mainly contains a aliphatic polycarbonate segment, by an ester bond. Preferably, the polyester segment contains mainly a polyester having a structure capable of being formed by condensation polymerization of an aromatic dicarboxylic acid with an aliphatic glycol and/or an alicyclic glycol. The aliphatic polycarbonate segment is contained in an amount of 50 weight % or more and 70 weight % or lower, and more preferably 55 weight % or more and 65 weight % or lower in the entire amount of the copolymer polyester elastomer. In the case where the copolymerization ratio of the aliphatic polycarbonate segment is too low, the flexibility and adhesion strength of the copolymer polyester tend to be low in low-temperature environments, and use of the copolymer polyester for applications exposed to the low-temperature environments becomes difficult. On the other hand, in the case where the copolymerization ratio of the aliphatic polycarbonate segment is too high, the heat resistance of the copolymer polyester elastomer is deteriorated, and the copolymer polyester elastomer tends to be thermally deteriorated during continuous use at 150° C.

The copolymer polyester elastomer to be used in the present invention is preferably crystalline, and particularly, those which are crystallized within a short time from the melted state are more preferable. Copolymer polyester elastomers are generally preserved and distributed while being molded into a pellet shape, and if the time to crystallize the copolymer polyester elastomer from the melted state is short, there is an advantage that blocking is hardly caused among pellets in the pelletization step and subsequent heating step during the production of the copolymer polyester elastomer. Further, if the time taken for crystallization from the melted state is short, the release property from a die is improved in the step for producing a sealed product of electrical/electronic part and high cycling in the production of electrical/electronic part can be expected.

In the present invention, a crystalline resin means a resin having an endothermic peak in DSC measurement. Practically, the crystalline resin of the present invention refers to a resin which shows a clear melting peak in one or both of two heating processes by temperature scanning of first heating to 300° C. at 20° C./minute from −100° C., then cooling to −100° C. at 50° C./minute, and successively heating to 300° C. at 20° C./minute with a differential scanning calorimeter (DSC). In the present invention, an amorphous resin refers to a resin which shows no melting peak in any of the two heating processes in the same DSC measurement.
<Hard Segment of Copolymer Polyester Elastomer>

The hard segment of the copolymer polyester elastomer to be used in the present invention includes a hard segment containing mainly a polyester segment.

An acid component constituting the polyester segment is not particularly limited, but it is preferable that the acid component has the composition containing an aromatic dicarboxylic acid with 8 to 14 carbon atoms in an amount of 50 mol % or more in all of acid components since it is effective to increase the melting point of the polyester elastomer and improve the heat resistance. Use of terephthalic acid and/or naphthalenedicarboxylic acid as the aromatic dicarboxylic acid with 8 to 14 carbon atoms is desirable in terms of polymerizability and productivity owing to high reactivity with glycol. The total of terephthalic acid and naphthalenecarboxylic acid is preferably 60 mol % or higher, more preferably 80 mol % or higher, and even more preferably 95 mol % or higher in all of acid components of the copolymer polyester elastomer, and further, all of acid components may be constituted with terephthalic acid and/or naphthalenecarboxylic acid. Any of 1,4-isomer, 2,3-isomer, 2,6-isomer, and the like are preferably usable as the naphthalenedicarboxylic acid, and 2,6-naphthalenedicarboxylic acid is particularly preferably used in terms of obtaining a polyester elastomer with high heat resistance.

Examples of other acid components constituting the polyester segment include dicarboxylic acids such as aromatic dicarboxylic acids including diphenyldicarboxylic acid, isophthalic acid, sodium 5-sulfoisophthalate, and the like; alicyclic dicarboxylic acids including cyclohexanedicarboxylic acid, tetrahydrophthalic acid anhydride, and the like; and aliphatic dicarboxylic acids including succinic acid, glutaric acid, adipic acid, azelaic acid, sebacic acid, dodecane diacid, dimer acid, hydrogenated dimer acid, and the like; and the like. These dicarboxylic acid components may be used to an extent that the melting point of the resin is not so significantly lowered, and their copolymerization ratio is lower than 30 mol %, and preferably lower than 20 mol % in all of acid components. Further, as the other acid components constituting the polyester segment, tri- or higher functional polycarboxylic acids such as trimellitic acid and pyromellitic acid are also usable. The copolymerization ratio of the tri- or higher functional polycarboxylic acids is preferably 10 mol % or lower, and more preferably 5 mol % or lower from the viewpoint of gelation prevention for the resin composition.

The aliphatic glycol or alicyclic glycol constituting the polyester segment is not particularly limited, and preferably the polyester segment contains an aliphatic glycol and/or alicyclic glycol with 2 to 10 carbon atoms in an amount of 50 mol % or more in all of glycol components, and more preferably the polyester segment contains alkylene glycols with 2 to 8 carbon atoms. Practical examples of a preferable glycol component include ethylene glycol, 1,3-propanediol, 1,4-butanediol, 1,6-hexanediol, 1,4-cyclohexanedimethanol, and the like. Use of 1,4-butanediol and 1,4-cyclohexanedimethanol is most preferable since it is effective to increase the melting point of the polyester elastomer and improve the heat resistance. Further, tri- or higher functional polyols such as glycerin, trimethylolpropane, and pentaerythritol may be used for some of the glycol components. The copolymerization ratio of the tri- or higher functional polyols is preferably 10 mol % or lower, and more preferably 5 mol % based on all of glycol components from the viewpoint of gelation prevention for the resin composition.

As a component constituting the polyester segment, those containing a butylene terephthalate unit or a butylene naphthalate unit are particularly preferable in terms of high melting point of the polyester elastomer and an improvement in its heat resistance, and also moldability and cost performance.

<Soft Segment of Copolymer Polyester Elastomer>

The soft segment of the copolymer polyester elastomer to be used in the present invention includes a soft segment containing mainly an aliphatic polycarbonate segment. Herein, "mainly" refers to a component in the highest weight ratio, that is, a soft segment containing an aliphatic polycarbonate segment in a weight ratio of more preferably 50 weight % or higher, further preferably 70 weight % or higher, furthermore preferably 90 weight % or higher, and most preferably 95 weight % or higher, and the soft segment may contain entirely an aliphatic polycarbonate segment.

The aliphatic polycarbonate segment is preferably a segment which is mainly composed of a polycarbonate structure formed by bonding an aliphatic diol residue with 2 to 12 carbon atoms with a carbonate group. Examples of the aliphatic diol residue may include straight chain alkylene glycol residues such as ethylene glycol, 1,3-propanediol, 1,4-butanediol, 1,5-pentanediol, 1,6-hexanediol, 1,9-nonanediol, and 1,10-decanediol; branched aliphatic glycol residues such as propylene glycol, 2-methyl-1,3-propanediol, neopentyl glycol, 1,2-butanediol, 1,3-butanediol, 3-methyl-1,5-pentanediol, 2,4-diethyl-1,5-pentanediol, 2,2,4-trimethyl-1,5-pentanediol, 2-methyl-octanediol, 2-butyl-2-ethyl-1,3-propanediol, and 2-methyl-1,8-octanediol; oxyalkylene glycol residues such as diethylene glycol and dipropylene glycol; and the like. Examples thereof further include aromatic ring-containing aliphatic glycol residues such as neopentyl hydroxypivalic acid ester, ethylene oxide adducts and propylene oxide adducts of bisphenol A; aliphatic glycol residues such as ethylene oxide adducts and propylene oxide adducts of hydrogenated bisphenol A, 1,4-cyclohexanedimethanol, and tricyclodecanedimethanol; and polyalkylene glycol residues such as polytetramethylene glycol, polypropylene glycol, and polyethylene glycol. In terms of flexibility and low-temperature properties of the copolymer polyester elastomer to be obtained, aliphatic diol residues with 4 to 12 carbon atoms are preferable, and aliphatic diol residues with 5 to 9 carbon atoms are particularly preferable. The aliphatic diol residues may be used alone or two or more kinds thereof may be used in combination.

The aliphatic polycarbonate segment may be formed by using an aliphatic polycarbonate diol. The aliphatic polycarbonate diol suitable for forming the aliphatic polycarbonate segment has a reduced viscosity of preferably 0.5 dl/g or higher, more preferably 0.8 dl/g or higher, and even more preferably 0.85 dl/g or higher. The aliphatic polycarbonate diol suitable for forming the aliphatic polycarbonate segment has a reduced viscosity of preferably 1.3 dl/g or lower, more preferably 1.2 dl/g or lower, and even more preferably 1.1 dl/g or lower. If the reduced viscosity of the polycarbonate diol is too low, the resistance to thermal aging of the copolymer polyester elastomer tends to be considerably lowered. On the other hand, it is difficult to produce a polycarbonate diol having a reduced viscosity of as high as 1.3 dl/g or higher with high reproducibility and it is disadvantageous in terms of cost.

A method for adjusting the reduced viscosity of the polycarbonate diol to be used for forming the polycarbonate segment is not particularly limited. A polycarbonate diol having a proper molecular weight may be purchased or polymerized, or a polycarbonate diol having a molecular weight adjusted by increasing the molecular weight of a polycarbonate diol having a low molecular weight with a chain extender such as diphenyl carbonate may be used. As the chain extender, alkyl carbonates such as dimethyl carbonate, diethyl carbonate, dipropyl carbonate, diisopropyl carbonate, and dibutyl carbonate and phosgenes can be used, and use of diphenyl carbonate is advantageous since the mole ratio is controlled in the easiest manner and the polymerization property is good.

<Terminal Vinyl Group of Copolymer Polyester Elastomer>

The copolymer polyester elastomer in the present invention has 6 equivalents/$10^6$ g or more and 50 equivalents/$10^6$ g or lower of terminal vinyl groups. The concentration of the terminal vinyl group is more preferably 8 equivalents/$10^6$ g or more, and further preferably 10 equivalents/$10^6$ g or more. The concentration of the terminal vinyl group is more preferably 40 equivalents/$10^6$ g or lower, and further preferably 30 equivalents/$10^6$ g or lower.

It has been conventionally known that a polyester resin may have a terminal vinyl group. For example, JP-A 2007-138139 discloses that if the content of a vinylcyclohexene structure in a polymer terminal is 5 μmol/g or higher, heat stability at the time of melting, particularly, color hue change (yellowing) tends to be increased and also resistance to hydrolysis tends to be worsened. As described in this publication, existence of a terminal vinyl group in a polyester resin causes adverse effects such as coloration and gelation, and in order to avoid this, it is generally recognized that it is important to suppress generation of a terminal vinyl group as much as possible.

In contrast, a terminal vinyl group in a specified concentration range is contained in the copolymer polyester elastomer to be used in the present invention, and therefore the intermolecular crosslinking reaction of the copolymer polyester elastomer is continuously advanced at a very slow reaction speed for a long time. The crosslinking points formed by this reaction have a low crosslinking density and a long distance between crosslinking points, and therefore the copolymer polyester elastomer is not cured or gelled and meanwhile, the copolymer polyester elastomer exhibits excellent effects of suppressing fragility under heat load and suppressing a decrease in tensile elongation, which are suitable for a resin composition to be used for a sealed product of electrical/electronic part. If the concentration of the terminal vinyl group is too low, properties such as tensile elongation are lowered with the lapse of time and flexibility as an elastomer is lost and the copolymer polyester elastomer tends to become fragile. If the concentration of the terminal vinyl group is too high, curing is advanced owing to excess crosslinking, and the flexibility is deteriorated and the copolymer polyester elastomer actually tends to become fragile. The copolymer polyester elastomer of the present invention can be dissolved in a mixed solvent (phenol/tetrachloroethylene=60/40 (weight ratio)) and does not show a gelled state even after moderate crosslinking is generated.

<Method for Producing Copolymer Polyester Elastomer>

A method for producing the copolymer polyester elastomer to be used in the present invention is not particularly limited, and for example, it is preferable to generate depolymerization reaction and transesterification (hereinafter, may be referred to as block reaction) by melt mixing a polyester constituting the hard segment and a polycarbonate diol constituting the soft segment under reduced pressure. The polyester constituting the hard segment is desirably a polyester having a number average molecular weight of 20,000 to 30,000 in terms of easiness of sealing and molding by melt molding. Further, adjustment of the reaction temperature for the blocking reaction to a range from the melting point of the polyester constituting the hard segment to the melting point+30° C. can suppress excess depolymerization of the polyester and can introduce the terminal vinyl group in a proper concentration into the copolymer polyester elastomer. Moreover, subsequent to the blocking reaction step, retention at pressure close to normal pressure for a prescribed duration in the temperature range from the melting point of the polyester constituting the hard segment to the melting point+30° C. (hereinafter, may be referred to as a waiting step) can increase the concentration of the terminal vinyl group of the copolymer polyester elastomer.

At the time of carrying out the blocking reaction, use of a proper kind of catalyst in a proper concentration is preferable. Examples of the proper catalyst may include titanium compounds such as titanium tetrabutoxide and potassium oxalate titanate; and tin compounds such as dibutyltin oxide, monohydroxybutyltin oxide, and dibutyltin diacetate, and these compounds may be used alone or two or more kinds thereof may be used in combination. The catalyst may previously exist in a polyester as a raw material for the hard segment or in a polycarbonate diol as a raw material for the soft segment, and in this case, it may be unnecessary to newly add a catalyst at the time of producing the copolymer polyester elastomer. Based on necessity, the catalyst in the hard segment or soft segment may be partially inactivated previously with an inactivator.

The polyester resin composition of the present invention preferably includes au antioxidant and/or a photostabilizer. The antioxidant is preferably an antioxidant containing a phenol skeleton, an antioxidant containing a sulfur atom, and an antioxidant containing a phosphorus atom. The photostabilizer is preferably a benzotriazole-based photostabilizer, a benzophenone-based photostabilizer, a hindered amine-based photostabilizer, a nickel-based photostabilizer, and a benzoate-based photostabilizer.

A preferred example of the antioxidant containing a phenol skeleton may include pentaerythritol tetrakis[(3,5-di-tert-butyl-4-hydroxyphenyl)propionate] (e.g., trade name: Irganox 1010, manufactured by BASF) and a preferred examples of the antioxidant containing a sulfur atom may include dilauryl 3,3'-thiodipropionate (e.g., trade name: Lasmit LG, manufactured by DAI-ICHI KOGYO SEIYAKU CO., LTD.).

The antioxidant containing a phenol skeleton is most preferably a hindered phenolic antioxidant, and examples thereof may include pentaerythritol tetrakis[3-(3,5-di-tert-butyl-4-hydroxyphenyl)propionate], thiodiethylene bis[3-(3,5-di-tert-butyl-4-hydroxyphenyl)propionate], octadecyl[3-(3,5-di-tert-butyl-4-hydroxyphenyl)propionate], N,N'-hexane-1,6-diyl bis[3-(3,5-di-tert-butyl-4-hydroxyphenylpropione amide, benzenepropanoic acid, 3,5-bis(1,1,-dimethylethyl)-4-hydroxy-C7-C9 side chain alkyl ester, 1,3,5-trimethyl-2,4,6-tris(3,5-di-tert-butyl-4-hydroxy)benzene, 1,6-hexanediol-bis[3-(3,5-di-tert-butyl-4-hydroxyphenyl)propionate], triethylene glycol-bis-3-(3-tert-butyl-4-hydroxy-5-methylphenyl)propionate, 3,3'-thiobispropionic acid dioctadecyl ester, 2,5,7,8-tetramethyl-(4',8',12'-trimethyltridecyl)chroman-6-ol, stearyl-β-(3,5-di-tert-butyl-4-hydroxyphenyl)propionate, 4',4'-butylidene bis(3-methyl-6-tert-butylphenol), and 3,9-bis[1,1-dimethyl-2-[β-(3-tert-butyl-4-hydroxy-5-methylphenyl)propionyloxy]ethyl]2,4,8,10-tetraoxaspiro[5,5]-undecane.

Examples of the antioxidant containing a sulfur atom include, but are not limited to, 3,3'-thiobispropionic acid didodecyl ester, 4,4'-thiobis(3-methyl-6-tert-butylphenol), dilauryl-3,3'-thiobispropionate, dimyristyl-3,3'-thiobispropionate, distearyl-3,3'-thiobispropionate, pentaerythritol tetrakis(3-laurylthiobispropionate), dioctadecyl-3,3'-thiobispropionate, and the like, and any antioxidants containing a sulfur atom can be used appropriately.

Examples of the antioxidant containing a phosphorus atom include, but are not limited to, tributyl phosphate, tris(2,4-di-butylphenyl)phosphite, distearylpentaerythritol diphosphite, cyclicneopentanetetrayl bis(2,6-di-tert-butyl-4-methylphenyl)phosphite, trisnonylphenyl phosphite, tris(2,4-di-tert-butylphenyl)phosphite, distearylpentaerythritol diphosphite, bis(2,4-di-tert-butylphenyl)pentaerythritol phosphite, bis(2,6-di-tert-butyl-4-methyl-phenyl)pentaerythritol phosphite, 2,2-methylene-bis(4,6-di-tert-butylphenyl)octyl phosphite, tetrakis(2,4-di-tert-butylphenyl)-4,4'-biphenylene-diphosphonite, tetrakis(2,4-di-tert-butylphenyl)-4,4'-biphenylene-diphosphonite, and the like, and any antioxidants containing a phosphorus atom can be used appropriately.

Examples of the benzotriazole-based photostabilizer include, but are not limited to, 2-(3,5-di-tert-amyl-2'-hydroxyphenyl)benzotriazole, 2-(2-hydroxy-5-tert-octylphenyl)benzotriazole, 2-(2'-hydroxy-3'-tert-butyl-5'-methylphenyl)-5-chlorobenzotriazole, 2-(2H-benzotriazol-2-yl)-p-cresol, 2-(2'-hydroxy-5'-methylphenyl)-benzotriazole, 2,4-di-tert-butyl-6-(5-chlorobenzotriazol-2-yl)phenol, 2-[2-hydroxy-3,5-di(1,1-dimethylbenzyl)]-2H-benzotriazole, and the like, and any benzotriazole-based photostabilizers can be used appropriately.

Examples of the benzophenone-based photostabilizer include, but are not limited to, 2-hydroxy-4-(octyloxy)benzophenone, 2,4-dihydroxybenzophenone, 2-hydroxy-4-methoxybenzophenone, 2-hydroxy-4-methoxybenzophenone, 2-hydroxy-4-methoxy-benzophenone-5-sulfonic acid, 2-hydroxy-4-n-dodecyloxybenzophenone, bis(5-benzoyl-4-hydroxy-2-methoxyphenyl)methane, 2,2'-dihydroxy-4-methoxybenzophenone, 2,2'-dihydroxy-4,4'-dimethoxybenzophenone, and the like, and any benzophenone-based photostabilizers can be used appropriately.

Examples of the hindered amine-based photostabilizer include, but are not limited to, bis(2,2,6,6-tetramethyl-4-piperidyl) sebacate, polycondensate of succinic acid dimethyl and 1-(2-hydroxyethyl)-4-hydroxy-2,2,6,6-tetramethylpiperidine, poly[{6-(1,1,3,3-tetramethylbutyl)amino-1,3,5-triazine-2,4-diyl}{(2,2,6,6-tetramethyl-4-piperidyl) imino}hexamethylene (2,2,6,6-tetramethyl-4-piperidyl)

imino}], 1,3,5-tris(3,5-di-tert-butyl-4-hydroxybenzyl)-s-triazine-2,4,6(1H,3H,5H)trione, tris(4-tert-butyl-3-hydroxy-2,6-dimethylbenzyl)-s-triazine-2,4,6-[1H,3H,5H]trione, and the like, and any hindered amine-based photostabilizers can be used appropriately.

Examples of the nickel-based photostabilizer include, but are not limited to, [2,2'-thio-bis(4-tert-octylphenolate)]-2-ethylhexylamine-nickel-(II), nickel dibutyldithiocarbamate, [2,2'-thio-bis(4-tert-octylphenolate)]-n-butylamine-nickel, and the like, and any nickel-based photostabilizers can be used appropriately.

Examples of the benzoate-based photostabilizer include, but are not limited to, 2,4-di-tert-butylphenyl-3,5'-di-tert-butyl-4'-hydroxybenzoate, and the like, and any benzoate-based photostabilizers can be used appropriately.

It is effective to add a phosphorus-based compound as a stabilization assisting agent to the polyester resin composition of the present invention. Examples of the phosphorus-based compound suitable as a stabilization assisting agent may include phosphonic acids such as phenyl phosphonic acids. Practical examples of the phosphonic acids may include, in addition to phenylphosphonic acid above, benzylphosphonic acid, o-methylbenzylphosphonic acid, naphthylphosphonic acid, chlorophenylphosphonic acid, difluorophenylphosphonic acid, tolylphosphonic acid, ethylphosphonic acid, tert-butylphosphonic acid, cyclohexylphosphonic acid, tetradecylphosphonic acid, methylphosphonic acid, di-tert-butylphenylphosphonic acid, diisopropylphenylphosphonic acid, methoxyphenylphosphonic acid, ethoxyphenylphosphonic acid, tert-butoxyphenylphosphonic acid, isopropoxyphenylphosphonic acid, benzyloxyphenylphosphonic acid, dimethoxyphenylphosphonic acid, phenoxyphenylphosphonic acid, tolyloxyphenylphosphonic acid, methoxyphenoxyphenylphosphonic acid, phenoxyethylphosphonic acid, biphenyloxyethylphosphonic acid, phenoxypropylphosphonic acid, biphenyloxypropylphosphonic acid, benzyloxyethylphosphonic acid, benzyloxypropylphosphonic acid, and the like. Although the proper addition amount of these phosphorus-based compounds differs depending on the reaction temperature, catalyst amount, and the like, it is preferable to adjust the addition amount in such a manner that 60 to 140 weight % of phosphorus atoms are contained to the weight of metal atoms contained in the catalyst. If the addition amount of the phosphorus-based compounds is too small, transesterification is not suppressed sufficiently, and the crystallinity of the elastomer to be obtained is not improved. On the other hand, if the addition amount of the phosphorus-based compounds is too large, the crystallinity becomes good but it may be possible to damage an electrical/electronic part, which is an object to be sealed, by bleeding out of the phosphorus compounds.

A method for adding the phosphorus-based compound is not particularly limited, but addition after compatibilization reaction of the soft segment and the hard segment is advantageous in terms of suppressing thermal deterioration at the time of producing the polyester elastomer in the initial stage of the production. However, it is allowable to add the compound at the time of re-melting or compounding an additive.

Other components may be added to the polyester resin composition of the present invention according to the applications. Examples of the other components include an impact resistant improver, a filler, an ultraviolet absorbent, a surface treatment agent, a lubricant, a pigment, an antistatic agent, an antibacterial agent, a crosslinking agent, a flame retardant, a plasticizer, a processing aid, a foaming agent, and the like.

A method for sealing an electrical/electronic part with the polyester resin composition of the present invention is not particularly limited, and for example, injection molding, extrusion molding with a die, injection molding, torpedo injection molding, torpedo extrusion molding, and the like can be employed. Production of a sealed product of electrical/electronic part by installing at least one of an electric cable, a circuit, and a terminal in a die and then injecting the resin composition of the present invention into the die after imparting fluidability to the resin composition under heating is particularly preferable in terms of suppressing damages on the substrate, circuit, and solder installed in the die.

EXAMPLES

Hereinafter, the present invention will be described practically with reference to Examples and Comparative Examples; however, the present invention should not be limited thereto.

The physical properties of resin compositions were evaluated by the following methods.

(1) Reduced Viscosity

Each sample in an amount of 0.05 g was dissolved in 25 mL of a mixed solvent (phenol/tetrachloroethane=60/40 (weight ratio)) and the reduced viscosity was measured by an Ubbelohde viscometer at 30° C.

(2) Melting Point (Tm)

Each sample vacuum dried at 50° C. for 15 hours under reduced pressure was heated from room temperature at 20° C./minute and the melting point thereof was measured by using a differential scanning calorimeter DSC-50 (manufactured by SHIMADZU CORPORATION). Herein, 10 mg of each measurement sample was weighed on an aluminum pan (stock number 900793.901, manufactured by TA Instruments, Inc.) and kept in a sealed state with an aluminum cover (stock number 900794.901, manufactured by TA Instruments, Inc.) and the measurement was carried out in an argon atmosphere.

(3) Melt Mass Flow Rate (MFR)

Each sample was dried at 100° C. for 12 hours in an oven and MFR was measured in accordance with JIS K7210:1999. The measurement was carried out at a load of 1000 g by using Melt indexer F-F01 manufactured by TOYO SEIKI CO., LTD. as a measurement apparatus and setting the measurement temperature at the melting point (Tm)+20° C.

(4) Crystallinity

Whether each sample was crystalline or amorphous was determined by whether a clear melting peak was exhibited in one or both of heating processes during twice heating processes in DSC measurement as described above. Further, for a sample which was confirmed to be crystalline, the time taken for crystallization from the melted state was measured and the result was employed as an index of the degree of crystallinity. That is, about 100 g of a resin composition melted at the production temperature was poured to a metal bat coated with Teflon and cooled in the air in a normal temperature and normal humidity atmosphere (around 23° C. and around 65% relative humidity), and the whitening due to crystallization was observed with eyes and the evaluation was evaluated in accordance with the following criteria.

AAA: Whitening occurred within 10 minutes.
AA: Whitening occurred more than 10 minutes and within 60 minutes.
A: Whitening occurred more than 60 minutes and within 24 hours.
B: Whitening did not occur within 24 hours.

(5) Concentration of Terminal Vinyl Group

Each polyester resin composition was dissolved in a mixed liquid of $CDCl_3$/trifluoroacetic acid-d (85/15% by volume)

and subjected to ¹H-NMR measurement to quantitatively measure the vinyl group terminal concentration.

The properties of each molded product were measured by the following methods.

(1) Resistance to Thermal Aging in Tensile Elongation

<Production of Specimen for Measuring Tensile Elongation>

A flat plate molding die (die inner dimension: width 100 mm×length 100 mm×thickness 2 mm) was prepared and each polyester elastomer resin composition was injected through a gate formed in the center of the face of 100 mm×100 mm by an injection molding apparatus (model-SAV, manufactured by SANTO SEIKI CO., LTD.) and molded. The molding conditions were set at a pressure of 3.0 MPa, a cylinder temperature of (Tm+20° C.), and a die temperature of 30° C. A number 3 dumbbell (thickness 2 mm) defined in JIS K6251: 2010 was produced from the flat plate of 100 mm×100 mm×2 mm thickness by a punching machine.

<Evaluation of Initial Tensile Elongation>

The tensile elongation of the number 3 dumbbell was measured in accordance with JIS K6251:2010.

<Evaluation of Resistance to Thermal Aging in Tensile Elongation>

The number 3 dumbbell was treated in a gear type oven at 150° C. for 1000 hours and allowed to stand still in normal temperature and normal humidity overnight and then tensile elongation was measured. The retention ratio of the tensile elongation to the initial tensile elongation was calculated and expressed in accordance with the following determination criteria to be used as an index of the resistance to thermal aging.

Determination standard:

AAA: retention ratio to initial tensile elongation was 70% or higher.

AA: retention ratio to initial tensile elongation was 60% or higher and lower than 70%.

A: retention ratio to initial tensile elongation was 50% or higher and lower than 60%.

B: retention ratio to initial tensile elongation was lower than 50%.

(2) Resistance to Thermal Aging in Adhesion

<Manufacture of Specimen for Measuring Adhesion Strength>

A polybutylene terephthalate plate with a thickness of 2 mm was cut into a size of 70 mm×70 mm and the surface thereof was wiped with acetone to remove oil. This polybutylene terephthalate plate was then fixed in the inside of a flat plate molding die (die inner dimension: width 100 mm×length 100 mm×thickness 5 mm) and a cellophane tape with a width of 10 mm was stuck to one side of the polybutylene terephthalate plate. Each polyester elastomer resin composition was then injected through a gate formed in the center of the face of 100 mm×100 mm by an injection molding apparatus (model-SAV, manufactured by SANJO SEIKI CO., LTD.) and molded. The molding conditions were set at a pressure of 3.0 MPa, a cylinder temperature of (Tm+20° C.), and a die temperature of 30° C. The molded product was released and aged in normal temperature for 24 hours, and then cut into strips each having 20 mm width and a portion to which a cellophane tape was stuck to obtain specimens for measuring adhesion strength.

<Evaluation of Initial Adhesion>

The polybutylene terephthalate plate and the polyester resin composition were separated from the portion to which a cellophane tape was stuck in each specimen for measuring adhesion strength, and peel strength at 180° peeling was measured. The tensile speed was 50 mm/minute and the test temperature was 23° C.

<Evaluation of Resistance to Thermal Aging>

Each specimen for measuring adhesion strength was treated in a gear type hot air dryer at 150° C. for 1000 hours and allowed to stand still in normal temperature and normal humidity overnight, and then peel strength at 180° peeling was measured. The retention ratio of the peel strength to the initial peel strength was calculated and expressed in accordance with the following determination criteria to be used as an index of the resistance to thermal aging.

Determination standard:

AAA: retention ratio to initial peel strength was 80% or higher.

AA: retention ratio to initial peel strength was 70% or higher and lower than 80%.

A: retention ratio to initial peel strength was 60% or higher and lower than 70%.

B: retention ratio to initial peel strength was lower than 60%.

(3) Resistance to Thermal Aging in Insulation

<Production of Specimen for Measuring Insulation>

A flat plate molding die (die inner dimension: width 125 mm×length 125 mm×thickness 2 mm) was prepared and each polyester elastomer resin composition was injected through a gate formed in the center of the face of 125 mm×125 mm by an injection molding apparatus (model-SAV, manufactured by BANJO SEIKI CO., LTD.) and molded. The molding conditions were set at a pressure of 3.0 MPa, a cylinder temperature of (Tm+20° C.), and a die temperature of 30° C. Each molded product was released from the die and each obtained flat plate with a length of 125 mm, a width of 125 mm, and a thickness of 2 mm was used as a specimen for evaluation of insulation.

<Evaluation of Initial Dielectric Breakdown Strength>

The dielectric breakdown strength of each specimen for evaluation of insulation was measured in accordance with IEC 60243-1 in the following conditions.

Test method: short time method

Pressure rising speed: 4 kV/second

Test electrode: column-type electrode with diameter of 25 mm/column-type electrode with diameter of 25 mm Determination standard:

AAA: dielectric breakdown strength was 25 kV/mm or higher.

AA: dielectric breakdown strength was 22 kV/mm or higher and lower than 25 kV/mm.

A: dielectric breakdown strength was lower than 22 kV/mm.

<Evaluation of Resistance to Thermal Aging>

Each specimen for evaluation of insulation was treated in a gear type hot air dryer at 150° C. for 1000 hours and allowed to stand still in normal temperature and normal humidity overnight, and then dielectric breakdown strength was measured. The retention ratio of the dielectric breakdown strength to the initial dielectric breakdown strength was calculated and expressed in accordance with the following determination criteria to he used as an index of the resistance to thermal aging.

Determination standard:

AAA: retention ratio to initial dielectric breakdown strength was 70% or higher.

AA: retention ratio to initial dielectric breakdown strength was 60% or higher and lower than 70%.

A: retention ratio to initial dielectric breakdown strength was 50% or higher and lower than 60%.

B: retention ratio to initial dielectric breakdown strength was lower than 50%.

(4) Durability with Respect to Hot-Cold Cycling

A polybutylene terephthalate plate with a thickness of 2 mm was cut into a size of 70 mm×70 mm and the surface thereof was wiped with acetone to remove oil. This polybutylene terephthalate plate was then fixed in the inside of a flat plate molding die (die inner dimension: width 100 mm×length 100 mm×thickness 5 mm) and a cellophane tape with a width of 10 mm was stuck to one side of the polybutylene terephthalate plate. Each polyester elastomer resin composition was then injected through a gate formed in the center of the face of 100 mm×100 mm by an injection molding apparatus (model-SAV, manufactured by BANJO SEIKI CO., LTD.) and molded. The molding conditions were set at a pressure of 3.0 MPa, a cylinder temperature of (Tm+20° C.), and a die temperature of 30° C. The molded product was released and aged in normal temperature for 24 hours, and then cut into strips each having 20 mm width and a portion to which a cellophane tape was stuck to be used as a specimen for durability with respect to hot-cold cycling. Each specimen was exposed to an environmental load of hot-cold cycling (1000 cycles each executed by keeping at −40° C. for 30 minutes and successively at 150° C. for 30 minutes) and the peel strength was measured after the specimen was turned back to normal temperature. The retention ratio to the initial peel strength was calculated and expressed in accordance with the following determination criteria to be used as an index of durability to hot-cold cycling. The peel strength was measured in accordance with the method described in <Evaluation of initial adhesion> in the item of (2) Resistance to thermal aging in adhesion.

Determination standard:

AAA: retention ratio to initial peel strength was 80% or higher.

AA: retention ratio to initial peel strength was 70% or higher and lower than 80%.

A: retention ratio to initial peel strength was 60% or higher and lower than 70%.

B: retention ratio to initial peel strength was lower than 60%.

[Production Example of Hard Segment Raw Material]
<Synthesis Example of PBT>

A reaction vessel equipped with a stirrer, a thermometer, and a condenser for draining was loaded with 882 parts by weight of terephthalic acid, 696 parts by weight of 1,4-butanediol, and 0.995 parts by weight of tetrabutyl titanate, and esterification reaction was carried out at 170 to 220° C. for 1 hour. Next, the reaction system was heated from 220° C. to 250° C. and on the other hand, the pressure in the inside of the system was slowly decreased to 500 Pa over 70 minutes. Further, polycondensation reaction was carried out at 130 Pa or lower for 70 minutes to obtain PBT.

<Synthesis Example of PBN>

PBN was obtained in the same production manner as in synthesis example of PBT, except that the reaction temperature and the raw materials were changed.

<Synthesis Example of Copolymer Polyester A>

A reaction vessel equipped with a stirrer, a thermometer, and a condenser for draining was loaded with 530 parts by weight of terephthalic acid, 85 parts by weight of isophthalic acid, 203 parts by weight of adipic acid, 928 parts by weight of 1,4-butanediol, and 0.34 parts by weight of tetrabutyl titanate, and esterification reaction was carried out at 150 to 245° C. for 2 hours. Next, the reaction system was heated from 220° C. to 250° C. and on the other hand, the pressure in the inside of the system was slowly decreased to 500 Pa over 60 minutes. Further, polycondensation reaction was carried out at 130 Pa or lower for 55 minutes to obtain a copolymer polyester A.

<Synthesis Example of Copolymer Polyester B>

A reaction vessel equipped with a stirrer, a thermometer, and a condenser for draining was loaded with 174.3 parts by weight of terephthalic acid, 74.7 parts by weight of isophthalic acid, 180 parts by weight of 1,4-butanediol, and 0.2 parts by weight of tetrabutyl titanate, and esterification reaction was carried out at 150 to 245° C. for 2 hours. Next, the reaction system was heated from 220° C. to 250° C. and on the other hand, the pressure in the inside of the system was slowly decreased to 500 Pa over 60 minutes. Further, polycondensation reaction was carried out at 130 Pa or lower for 55 minutes to obtain a copolymer polyester B.

TABLE 1

| polyester | resin composition (mol %) | number average molecular weight | melting point ° C. |
| --- | --- | --- | --- |
| PBT | T/BD = 100/100 | 0.70 | 225 |
| PBN | NDC/BD = 100/100 | 0.75 | 243 |
| copolymer polyester A | T/I/AA//BD = 65/10/25//100 | 0.79 | 166 |
| copolymer polyester B | T/I//BD = 70/30//100 | 0.73 | 176 |

The following abbreviations were used for the resin composition in Table 1.

T: Terephthalic acid residue
I: Isophthalic acid residue
NDC: Naphthalenedicarboxylic acid residue
AA: Adipic acid residue
BD: 1,4-butanediol residue

[Production Example of Soft Segment Raw Material]
<Synthesis Example of Aliphatic Polycarbonate Diol A>

An aliphatic polycarbonate diol (Carbonate diol UH-CARB 200, manufactured by Ube Industries Ltd., molecular weight 2000, homopolymer type) in an amount of 100 parts by mass and diphenyl carbonate in an amount of 9.6 parts by mass were loaded, respectively, and allowed to react at a temperature of 205° C. and 130 Pa. Two hours later, the contents were cooled to obtain an aliphatic polycarbonate diol A-1. The reaction time was appropriately changed to synthesize polycarbonate diols A-2 to A-16 with various degrees of polymerization. The reduced viscosity of each of the obtained polycarbonate diols was shown in Table 2. Hereinafter, the polycarbonate diols A-1 to A-16 may be referred to collectively as PCD-A, and may be abbreviated individually as PCD-A-1 and the like.

<Synthesis Example of Aliphatic Polycarbonate Diol B>

An aliphatic polycarbonate diol (Carbonate diol "DURANOL" (registered trade name), manufactured by Asahi Kasei Chemicals Co., Ltd., molecular weight 2000, copolymer type) in an amount of 100 parts by mass and diphenyl carbonate in an amount of 9.6 parts by mass were loaded, and allowed to react at a temperature of 205° C. and 130 Pa. Two hours later, the contents were cooled to obtain an aliphatic polycarbonate diol B (hereinafter, the polycarbonate diols B may be abbreviated as PCD-B). The reduced viscosity of each of the obtained polycarbonate diols was shown in Table 2.

<Synthesis Example of Aliphatic Polycarbonate Diol C>

An aliphatic polycarbonate diol (Carbonate diol manufactured by Kuraray Co., Ltd., molecular weight 2000, copolymer type) in an amount of 100 parts by mass and diphenyl carbonate in an amount of 9.6 parts by mass were loaded, respectively, and allowed to react at a temperature of 205° C. and 130 Pa. Two hours later, the contents were cooled to obtain an aliphatic polycarbonate diol C (hereinafter, the polycarbonate diols C may be abbreviated as PCD-C). The reduced viscosity of each of the obtained polycarbonate diols was shown in Table 2.

TABLE 2

| polycarbonate diol | reduced viscosity dl/g |
|---|---|
| A-1 | 0.90 |
| A-2 | 0.88 |
| A-3 | 1.30 |
| A-4 | 0.85 |
| A-5 | 0.88 |
| A-6 | 0.87 |
| A-7 | 0.88 |
| A-8 | 0.89 |
| A-9 | 0.90 |
| A-10 | 0.92 |
| A-11 | 0.87 |
| A-12 | 0.50 |
| A-13 | 0.90 |
| A-14 | 0.90 |
| A-15 | 0.90 |
| A-16 | 0.90 |
| B | 0.87 |
| C | 0.92 |

Example 1

As a hard segment raw material, 100 parts by mass of polybutylene terephthalate (PBT) with a number average molecular weight of 20,000, and as a soft segment raw material, 150 parts by mass of the aliphatic polycarbonate diol A-1 were mixed and stirred at 230° C. to 245° C. and 130 Pa for 1 hour (hereinafter, may be referred to as a blocking reaction step), and it was confirmed that the mixture became transparent. Thereafter, the contents were stirred at normal pressure for 10 minutes under nitrogen flow (hereinafter, may be referred to as a waiting step) and taken out for cooling. The copolymer polyester elastomer obtained in the above-mentioned manner was added with phenylphosphonic acid in an amount of 60 mg/kg (in terms of phosphorus atom), 0.3 parts by weight of Lasmit LG as an antioxidant, and 0.3 parts by weight of Irganox 1010, and the mixture was kneaded at 250° C. to obtain a polyester resin composition. The evaluation results for physical properties of the obtained polyester resin composition and physical properties of a molded product were shown in Table 1. The polyester resin composition obtained in each Example was excellent in any physical properties including crystallinity, and thus had high quality as a sealing material.

Examples 2 to 14

Polyester resin compositions of Examples 2 to 14 were obtained in the same manner as in Example 1; however, the raw material compositions were changed as described in Tables 1 and 2, and the temperature and time for the blocking reaction step and the temperature and time for the waiting step were adjusted. The temperature in the blocking reaction step and that of the waiting step were adjusted to a range from the melting point of the hard segment to the melting point+30° C. The evaluation results for physical properties of the obtained polyester resin composition and physical properties of a molded product were shown in Table 1. All of the polyester resin compositions obtained in Examples were excellent in any physical properties including crystallinity, and thus had high quality as a sealing material.

TABLE 3

| | | | Example 1 | Example 2 | Example 3 | Example 4 | Example 5 | Example 6 |
|---|---|---|---|---|---|---|---|---|
| compound of resin composition | hard segment weight % | PBT | 40 | 40 | 40 | 40 | 40 | 40 |
| | | PBN | | | | | | |
| | | copolymer polyester A | | | | | | |
| | | copolymer polyester B | | | | | | |
| | soft segment | kind of PCD | A-1 | A-2 | B | C | A-3 | A-4 |
| | | weight % | 60 | 60 | 60 | 60 | 60 | 60 |
| | stabilization assisting agent mg/kg as P | phenylphosphonic acid | 80 | 60 | 100 | 120 | 140 | 60 |
| | | tert-butylphosphonic acid | | | | | | |
| | | phenylphosphonic acid sodium | | | | | | |
| | antioxidant mg/kg | Lasmit LG | 0.3 | 0.3 | 0.3 | 0.3 | 0.3 | 0.3 |
| | | Irganox1010 | 0.3 | 0.3 | 0.3 | 0.3 | 0.3 | 0.3 |
| physical properties of resin composition | terminal vinyl group equivalent/$10^6$ g | | 13 | 20 | 22 | 10 | 9 | 24 |
| | reduced viscosity dl/g | | 0.9 | 0.85 | 0.84 | 0.89 | 0.85 | 0.6 |
| | melting point Tm ° C. | | 205 | 200 | 200 | 190 | 210 | 200 |
| | MFR at the melting point (Tm) + 20° C. g/10 min | | 80 | 90 | 90 | 85 | 89 | 115 |
| | crystallinity | | AAA | AAA | AA | AA | AAA | AAA |
| properties of molded product | resistance to thermal aging in tensile elongation (retention ratio to initial tensile elongation) | | AA | AA | AA | AA | AA | AA |
| | initial peel strength N/2 cm | | 40 | 30 | 45 | 48 | 39 | 41 |
| | resistance to thermal aging in adhesion (retention ratio to initial peel strength) | | AAA | AAA | AAA | AAA | AAA | AAA |
| | initial dielectric breakdown strength | | AA | AA | AA | AA | AA | AA |
| | resistance to thermal aging in insulation (retention ratio to initial dielectric breakdown strength) | | AA | AA | AA | AA | AA | AA |
| | durability with respect to hot-cold cycling (retention ratio to initial peel strength) | | AA | AA | AA | AA | AA | AA |

TABLE 4

| | | | Example 7 | Example 8 | Example 9 | Example 10 | Example 11 | Example 12 |
|---|---|---|---|---|---|---|---|---|
| compound of resin composition | hard segment weight % | PBT | | | | 35 | 30 | 40 |
| | | PBN | 40 | | | | | |
| | | copolymer polyester A | | | 40 | | | |
| | | copolymer polyester B | | 40 | | | | |
| | soft segment | kind of PCD | A-5 | A-6 | A-7 | A-8 | A-9 | A-10 |
| | | weight % | 60 | 60 | 60 | 65 | 70 | 60 |
| | stabilization assisting agent mg/kg as P | phenylphosphonic acid | 80 | | | 80 | 100 | 60 |
| | | tert-butylphosphonic acid | | 60 | | | | |
| | | phenylphosphonic acid sodium | | | 60 | | | |
| | antioxidant mg/kg | Lasmit LG | 0.3 | 0.3 | 0.3 | 0.3 | 0.3 | 0.3 |
| | | Irganox1010 | 0.3 | 0.3 | 0.3 | 0.3 | 0.3 | 0.3 |
| physical properties of resin composition | terminal vinyl group equivalent/$10^6$ g | | 13 | 13 | 13 | 8 | 6 | 40 |
| | reduced viscosity dl/g | | 0.87 | 0.83 | 0.84 | 0.88 | 0.9 | 0.89 |
| | melting point Tm ° C. | | 230 | 180 | 200 | 140 | 150 | 205 |
| | MFR at the melting point (Tm) + 20° C. g/10 min | | 85 | 95 | 92 | 90 | 80 | 80 |
| | crystallinity | | AAA | AA | AA | AA | A | AAA |
| properties of molded product | resistance to thermal aging in tensile elongation (retention ratio to initial tensile elongation) | | AA | AA | AA | AA | AA | AAA |
| | initial peel strength N/2 cm | | 20 | 49 | 39 | 38 | 43 | 40 |
| | resistance to thermal aging in adhesion (retention ratio to initial peel strength) | | AAA | AAA | AAA | AAA | A | AAA |
| | initial dielectric breakdown strength | | AA | AA | AA | AA | AA | AA |
| | resistance to thermal aging in insulation (retention ratio to initial dielectric breakdown strength) | | AA | AA | AA | AA | AA | AAA |
| | durability with respect to hot-cold cycling (retention ratio to initial peel strength) | | AA | AA | AA | AAA | AAA | AA |

TABLE 5

| | | | Example 13 | Example 14 | Comparative Example 1 | Comparative Example 2 | Comparative Example 3 | Comparative Example 4 |
|---|---|---|---|---|---|---|---|---|
| compound of resin composition | hard segment weight % | PBT | 50 | 40 | 40 | 40 | 70 | 20 |
| | | PBN | | | | | | |
| | | copolymer polyester A | | | | | | |
| | | copolymer polyester B | | | | | | |
| | soft segment | kind of PCD | A-11 | A-12 | A-13 | A-14 | A-15 | A-16 |
| | | weight % | 50 | 60 | 60 | 60 | 30 | 80 |
| | stabilization assisting agent mg/kg as P | phenylphosphonic acid | 80 | | 60 | 60 | 60 | 60 |
| | | tert-butylphosphonic acid | | | | | | |
| | | phenylphosphonic acid sodium | | 60 | | | | |
| | antioxidant mg/kg | Lasmit LG | 0.3 | 0.3 | 0.3 | 0.3 | 0.3 | 0.3 |
| | | Irganox1010 | 0.3 | 0.3 | 0.3 | 0.3 | 0.3 | 0.3 |
| physical properties of resin composition | terminal vinyl group equivalent/$10^6$ g | | 50 | 6 | 60 | 2 | 21 | 20 |
| | reduced viscosity dl/g | | 0.81 | 0.9 | 0.85 | 0.9 | 0.9 | 0.87 |
| | melting point Tm ° C. | | 215 | 180 | 200 | 200 | 220 | 120 |
| | MFR at the melting point (Tm) + 20° C. g/10 min | | 82 | 81 | 90 | 80 | 5 | 86 |
| | crystallinity | | AAA | A | AAA | AAA | AAA | B |
| properties of molded product | resistance to thermal aging in tensile elongation (retention ratio to initial tensile elongation) | | AAA | A | B | B | AAA | B |
| | initial peel strength N/2 cm | | 20 | 10 | 20 | 30 | 5 | 4 |
| | resistance to thermal aging in adhesion (retention ratio to initial peel strength) | | AA | A | A | A | AA | B |
| | initial dielectric breakdown strength | | AA | A | AAA | AAA | AAA | B |
| | resistance to thermal aging in insulation (retention ratio to initial dielectric breakdown strength) | | AAA | A | A | A | AA | B |
| | durability with respect to hot-cold cycling (retention ratio to initial peel strength) | | AA | A | B | A | B | B |

Comparative Example 1

As a hard segment raw material, 100 parts by mass of polybutylene terephthalate (PBT) with a number average molecular weight of 20,000, and as a soft segment raw material, 150 parts by mass of the PCD-A-13 were mixed and stirred at 230° C. to 245° C. and 130 Pa for 1 hour (a blocking reaction step), and it was confirmed that the resin became transparent. Thereafter, the contents were stirred at normal pressure for 10 minutes under nitrogen flow (a waiting step) and taken out for cooling to obtain a copolymer polyester elastomer. The copolymer polyester elastomer was added with phenylphosphonic acid in an amount of 60 mg/kg (in terms of phosphorus atom), and the mixture was kneaded at 250° C. to obtain a polyester resin composition. The evaluation results for physical properties of the obtained polyester resin composition and physical properties of a molded product were shown in Table 3. The polyester resin composition obtained in this Comparative Example had a terminal vinyl group of 60 equivalents/$10^6$ g and was gelled during preservation at 150° C. The peel strength retention ratio before and after resistance to thermal aging test, the volume resistance retention ratio before and after resistance to thermal aging test, and the peel strength retention ratio before and after hot-cold cycling test were worsened, and thus the polyester resin composition was not suitable as a sealing agent.

Comparative Examples 2 to 4

Polyester resin compositions of Comparative Examples 2 to 4 were obtained in the same manner as in Example 1; however, the raw material compositions were changed as described in Tables 3, and the temperature and time for the blocking reaction step and the temperature and time for the waiting step were adjusted. The evaluation results for physical properties of the obtained polyester resin composition and physical properties of a molded product were shown in Table 3. The polyester resin composition obtained in each Example was not suitable as a sealing agent.

The polyester resin composition of the present invention is described with reference to a plurality of Examples as described above; however, the invention is not limited to the configurations illustrated in Examples above, and the configuration can be appropriately modified without departing the gist of the invention such as an appropriate combination of the configurations illustrated in respective Examples.

INDUSTRIAL APPLICABILITY

The polyester resin composition of the present invention has higher resistance to thermal aging than that of the conventionally known polyester polyether-type elastomer, is excellent in melt fluidity, initial peel strength, and initial dielectric breakdown strength that are required for electrical/electronic part-sealing material, and also excellent in heat resistance, resistance to thermal aging, and durability with respect to hot-cold cycling. Therefore, the polyester resin composition of the present invention is useful as a polyester resin composition for electrical/electronic part-sealing material to be used in automobiles, domestic electric appliances, and the like, and particularly useful for protecting electrical/electronic parts to be used in environments where the parts are possibly exposed to high temperature load and hot-cold cycling, represented by an automotive engine room.

The invention claimed is:

1. A polyester resin composition for electrical/electronic part-sealing material, comprising, as a main component, a copolymer polyester elastomer containing 55 weight % or more and 70 weight % or less of an aliphatic polycarbonate segment and having 6 equivalents/$10^6$ g or more and 50 equivalents/$10^6$ g or less of terminal vinyl groups,
wherein the copolymer polyester elastomer has a chemical structure formed by linking a hard segment, which mainly contains a polyester segment, and a soft segment comprising said aliphatic polycarbonate segment,
and a component constituting the polyester segment is a butylene terephthalate unit or a butylene naphthalate unit.

2. The polyester resin composition for electrical/electronic part-sealing material according to claim 1, wherein the copolymer polyester elastomer is crystalline.

3. The polyester resin composition for electrical/electronic part-sealing material according to claim 1, wherein a polycarbonate diol to be used for forming the aliphatic polycarbonate segment is an aliphatic polycarbonate diol residue with a reduced viscosity of 0.5 dl/g or more and 1.3 dl/g or lower.

4. The polyester resin composition for electrical/electronic part-sealing material according to claim 2, wherein a polycarbonate diol to be used for forming the aliphatic polycarbonate segment is an aliphatic polycarbonate diol residue with a reduced viscosity of 0.5 dl/g or more and 1.3 dl/g or lower.

5. The polyester resin composition for electrical/electronic part-sealing material according to claim 1, wherein a polycarbonate diol to be used for forming the aliphatic polycarbonate segment is an aliphatic polycarbonate diol residue with a reduced viscosity of 0.5 dl/g or more and 1.3 dl/g or lower.

6. The polyester resin composition for electrical/electronic part-sealing material according to claim 2, wherein a polycarbonate diol to be used for forming the aliphatic polycarbonate segment is an aliphatic polycarbonate diol residue with a reduced viscosity of 0.5 dl/g or more and 1.3 dl/g or lower.

7. A sealed product of electrical/electronic part, which is sealed with the resin composition for electrical/electronic part-sealing material according to claim 1.

8. A method for producing a sealed product of electrical/electronic part comprising steps of: installing at least one of an electric cable, a circuit, and a terminal in a die; and injecting the resin composition for electrical/electronic part-sealing material according to claim 1 into the die after imparting fluidability to the resin composition under heating.

* * * * *